(12) United States Patent
Chen et al.

(10) Patent No.: US 8,641,828 B2
(45) Date of Patent: Feb. 4, 2014

(54) CLEANING METHOD OF SEMICONDUCTOR MANUFACTURING PROCESS

(75) Inventors: Yi-Wei Chen, Taichung (TW); Teng-Chun Tsai, Tainan (TW); Kuo-Chih Lai, Tainan (TW); Shu-Min Huang, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 176 days.

(21) Appl. No.: 13/181,573

(22) Filed: Jul. 13, 2011

(65) Prior Publication Data

US 2013/0014779 A1    Jan. 17, 2013

(51) Int. Cl.
*B08B 7/00*    (2006.01)

(52) U.S. Cl.
USPC .................................. 134/26; 134/1.2; 134/6

(58) Field of Classification Search
None
See application file for complete search history.

(56) References Cited

U.S. PATENT DOCUMENTS

| | | | |
|---|---|---|---|
| 5,183,771 A | 2/1993 | Mitsui |
| 5,523,694 A | 6/1996 | Cole |
| 6,017,824 A | 1/2000 | Lee |
| 6,034,439 A | 3/2000 | Teng |
| 6,048,788 A | 4/2000 | Huang |
| 6,140,224 A | 10/2000 | Lin |
| 6,147,007 A | 11/2000 | Yang |
| 6,159,833 A | 12/2000 | Lee |
| 6,228,209 B1 | 5/2001 | Chen |
| 6,251,791 B1 | 6/2001 | Tsai |
| 6,361,929 B1 | 3/2002 | Chung |
| 6,534,414 B1 | 3/2003 | Wang |
| 6,548,409 B1 | 4/2003 | Lee |
| 6,656,847 B1 | 12/2003 | Lin |
| 6,838,381 B2 | 1/2005 | Su et al. |
| 6,846,618 B2 | 1/2005 | Hsu |
| 6,866,723 B2 | 3/2005 | Ueda |
| 6,869,542 B2 | 3/2005 | Desphande et al. |
| 6,872,652 B2 * | 3/2005 | Fang ............................. 438/623 |
| 6,927,176 B2 | 8/2005 | Verhaverbeke et al. |
| 6,953,742 B2 | 10/2005 | Chen |
| 6,962,771 B1 | 11/2005 | Liu |
| 6,962,879 B2 | 11/2005 | Zhu |
| 7,038,224 B2 | 5/2006 | Kadyshevitch et al. |
| 7,060,609 B2 | 6/2006 | Lim |
| 7,156,927 B2 | 1/2007 | Christenson |
| 7,169,440 B2 | 1/2007 | Balasubramaniam |
| 7,189,641 B2 | 3/2007 | Lee |
| 7,432,210 B2 | 10/2008 | Wang |
| 7,550,381 B2 | 6/2009 | Lu |

(Continued)

OTHER PUBLICATIONS

T. C. Tsai, Yi-Wei Chen, Jerander Lai, J. F. Lin, C. C. Huang and J. Y. Wu, A comprehensive study for advanced in situ contact dry cleaning,United Microelectronics Corp. Advanced Technology Development Division, Tainan, Taiwan, 2012.

*Primary Examiner* — Nicole Blan
(74) *Attorney, Agent, or Firm* — Ding Yu Tan (57) ABSTRACT

A cleaning method of a semiconductor manufacturing process is provided. The cleaning method is applied to a semiconductor component including a plurality of material layers formed thereon. An opening is defined in the material layers, and a side wall is exposed from the opening. The side wall at least includes a first material layer and a second material layer. At first, a first cleaning process is performed till a lateral etched thickness of the first material layer is equal to a lateral etched thickness of the second material layer. Then, a byproduct formed in the first cleaning process is removed.

22 Claims, 4 Drawing Sheets

(56) References Cited

U.S. PATENT DOCUMENTS

| | | |
|---|---|---|
| 7,585,720 B2 | 9/2009 | Sudo |
| 7,718,081 B2 | 5/2010 | Liu |
| 2001/0005634 A1 | 6/2001 | Kajiwara |
| 2002/0160616 A1 | 10/2002 | Grebs |
| 2006/0170058 A1 | 8/2006 | Chiang |
| 2007/0015360 A1 | 1/2007 | Lu |
| 2007/0020565 A1 | 1/2007 | Koh |
| 2007/0082489 A1 | 4/2007 | Tsao |
| 2007/0249171 A1 | 10/2007 | Sung |
| 2007/0269976 A1 | 11/2007 | Futase |
| 2008/0064203 A1 | 3/2008 | Chou |
| 2008/0102553 A1 | 5/2008 | Shin |
| 2008/0121619 A1 | 5/2008 | Lin |
| 2008/0191287 A1 | 8/2008 | Chou |
| 2008/0286979 A1 | 11/2008 | Shin |
| 2008/0311711 A1* | 12/2008 | Hampp et al. ............... 438/197 |
| 2009/0102058 A1 | 4/2009 | Hsieh |
| 2009/0145877 A1 | 6/2009 | Chang |
| 2009/0191714 A1* | 7/2009 | Lai et al. .................... 438/706 |
| 2009/0298294 A1* | 12/2009 | Chen et al. .................. 438/723 |
| 2009/0320749 A1* | 12/2009 | Yoon et al. ..................... 118/58 |
| 2010/0304569 A1 | 12/2010 | Chou |

* cited by examiner

CLEANING METHOD OF SEMICONDUCTOR MANUFACTURING PROCESS

FIELD OF THE INVENTION

The present invention relates to a cleaning method, and particularly to a cleaning method of a semiconductor manufacturing process.

BACKGROUND OF THE INVENTION

In a process of forming a semiconductor integrated circuit (IC), it is necessary to perform a cleaning process to clean various components of the semiconductor integrated circuit. A dry cleaning process, for example, a physical bombardment process, is generally used. The physical bombardment process utilities a number of free argon ions ($Ar^+$) generated by argon (Ar) to remove oxides formed on surfaces of the components of the semiconductor integrated circuit. However, currently, the components of the semiconductor integrated circuit become smaller and smaller. For example, when a through hole formed in a component has a small size, a byproduct formed in the physical bombardment process will be deposited in the through hole. Thus, the size of the through hole will further be reduced. Further, if a surface of a silicon layer is located at the bottom of the through hole, the physical bombardment process will cause the surface of the silicon layer to be uneven, thereby generating a leakage current problem and increasing a resistance of the corresponding component.

Therefore, what is needed is a cleaning method of a semiconductor manufacturing process to overcome the above disadvantages.

SUMMARY OF THE INVENTION

The present invention provides a cleaning method of a semiconductor manufacturing process so as to avoid a deposition phenomenon of a byproduct during a cleaning process, thereby improving a smoothness of a side wall of a semiconductor component.

The present invention also provides a cleaning method of a semiconductor manufacturing process so as to avoid an uneven surface at a bottom of a contact through hole, thereby improving a performance of a semiconductor component.

The present invention provides a cleaning method of a semiconductor manufacturing process. The cleaning method is applied to a semiconductor component. The semiconductor component has a number of material layers formed thereon. An opening is defined in the material layers, and a side wall is exposed from the opening. The side wall at least includes a first material layer and a second material layer. At first, a first cleaning process is performed till a lateral etched thickness of the first material layer is equal to a lateral etched thickness of the second material layer. Then, a byproduct formed in the first cleaning process is removed.

In one embodiment of the present invention, the opening is a contact through hole, the first material layer is a silicon oxide layer, and the second material layer is a silicon nitride layer.

In one embodiment of the present invention, after removing the byproduct, the cleaning method further includes performing a second cleaning process till a lateral etched thickness of the first material layer is equal to a lateral etched thickness of the second material layer.

In one embodiment of the present invention, the first cleaning process, the step of removing the byproduct and the second cleaning process are performed on a common apparatus.

In one embodiment of the present invention, the first cleaning process is a chemical cleaning process.

In one embodiment of the present invention, the second cleaning process is a chemical cleaning process.

In one embodiment of the present invention, before performing the first cleaning process, the cleaning method further includes a physical cleaning process. The physical cleaning process includes a step of introducing a first reacting gas including argon so as to partially remove an oxide generated in the semiconductor process and located at a bottom of the contact through hole.

In one embodiment of the present invention, the chemical cleaning process is a fluorine-based chemical cleaning process.

In one embodiment of the present invention, the fluorine-based chemical cleaning process utilizes a second reacting gas comprising ammonia and nitrogen trifluoride, an operating temperature of the fluorine-based chemical cleaning process is less than 50° C., a flow rate of the ammonia is 5 standard cubic centimeter per minute, a flow rate of the nitrogen trifluoride is 100 standard cubic centimeter per minute, and an operating time of the fluorine-based chemical cleaning process is 17 seconds.

In one embodiment of the present invention, the byproduct is $(NH_4)_2SiF_6$, the byproduct is removed by applying a thermal process to the semiconductor component.

In one embodiment of the present invention, the thermal process includes the following steps. At first, a heat source is provided. A temperature of the heat source is 180° C. Then, the semiconductor component is moved to approach the heat source so that the byproduct is removed at a sublimation temperature.

In one embodiment of the present invention, the cleaning method further includes a degassing process before performing the first cleaning process.

In one embodiment of the present invention, after performing the first cleaning process, the cleaning method further includes a plurality of cleaning processes. Each of the cleaning processes is performed till a lateral etched thickness of the first material layer is equal to a lateral etched thickness of the second material layer. Then, a byproduct formed in each of the cleaning processes is removed.

The present invention also provides a cleaning method of a semiconductor manufacturing process. The cleaning method is applied to a contact through hole of a semiconductor component. At first, a physical cleaning process is performed to partially remove an oxide generated in the semiconductor process and located at a bottom of the contact through hole. Then a chemical cleaning process is performed to remove the residual oxide at the bottom of the contact through hole.

In one embodiment of the present invention, the physical cleaning process includes introducing a first reacting gas including argon.

In one embodiment of the present invention, the contact through hole is defined in the semiconductor component to form a side wall including at least a first material layer and a second material layer, the first material layer is a silicon oxide layer, and the second material layer is a silicon nitride layer.

In one embodiment of the present invention, the chemical cleaning process includes the following steps. At first, a first cleaning process is performed till a lateral etched thickness of the first material layer is equal to a lateral etched thickness of the second material layer. Then, a byproduct formed in the first cleaning process is removed.

In one embodiment of the present invention, after performing the first cleaning process, the chemical cleaning process further includes a plurality of cleaning processes, each of the cleaning processes are performed till a lateral etched thickness of the first material layer is equal to a lateral etched thickness of the second material layer. Then, a byproduct formed in each of the cleaning processes is removed.

In one embodiment of the present invention, the chemical cleaning process is a fluorine-based chemical cleaning process.

In one embodiment of the present invention, the fluorine-based chemical cleaning process utilizes a second reacting gas including ammonia and nitrogen trifluoride, an operating temperature of the fluorine-based chemical cleaning process is less than 50° C., a flow rate of the ammonia is 5 standard cubic centimeter per minute, a flow rate of the nitrogen trifluoride is 100 standard cubic centimeter per minute, and an operating time of the fluorine-based chemical cleaning process is 17 seconds.

In one embodiment of the present invention, the byproduct is $(NH_4)_2SiF_6$, the byproduct is removed by applying a thermal process to the semiconductor component.

In one embodiment of the present invention, the thermal process includes the following steps. At first, a heat source is provided, a temperature of the heating source is 180° C. And then, the semiconductor component is removed to approach the heat source so that the byproduct is removed at a sublimation temperature.

In one embodiment of the present invention, the cleaning method further includes a degassing process before performing the physical cleaning process.

The cleaning method of a semiconductor manufacturing process of the present invention includes a physical cleaning process (e.g., an argon physical bombardment process) and a chemical cleaning process (e.g., fluorine-based chemical cleaning process) so as to remove the oxide at the bottom of the contact through hole of the semiconductor component. The cleaning method can avoid increasing the resistance of the contact through hole of the semiconductor component and avoid enlarging the size of the contact through hole. The chemical cleaning process includes at least a fluorine-based chemical cleaning process, which is performed till the lateral etched thicknesses of the material layers are equal to each other. Therefore, the side wall comprised of the first material layer and the second material layer is smooth after the chemical cleaning process, and the oxide located at the bottom of the contact through hole is entirely removed. Further, the byproduct can be removed by a thermal process, the deposition phenomenon of the byproduct during the chemical cleaning process can be avoided.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

In order to solve the deposition phenomenon of the byproduct during the cleaning process and avoid the increase of the resistance of the component, a fluorine-based chemical cleaning process is developed so as to displace the physical bombardment process. However, the isotropic etching of the fluorine-based chemical cleaning process will enlarge the size of the contact through hole formed in the semiconductor component. The present invention provides a cleaning method of a semiconductor manufacturing process to reduce the resistance of the contact through hole of the semiconductor component and avoid enlarging the size of the contact through hole. The semiconductor manufacturing process can be, for example, a manufacturing process of a transistor with a poly-silicon gate or a metal gate.

Figure 1:
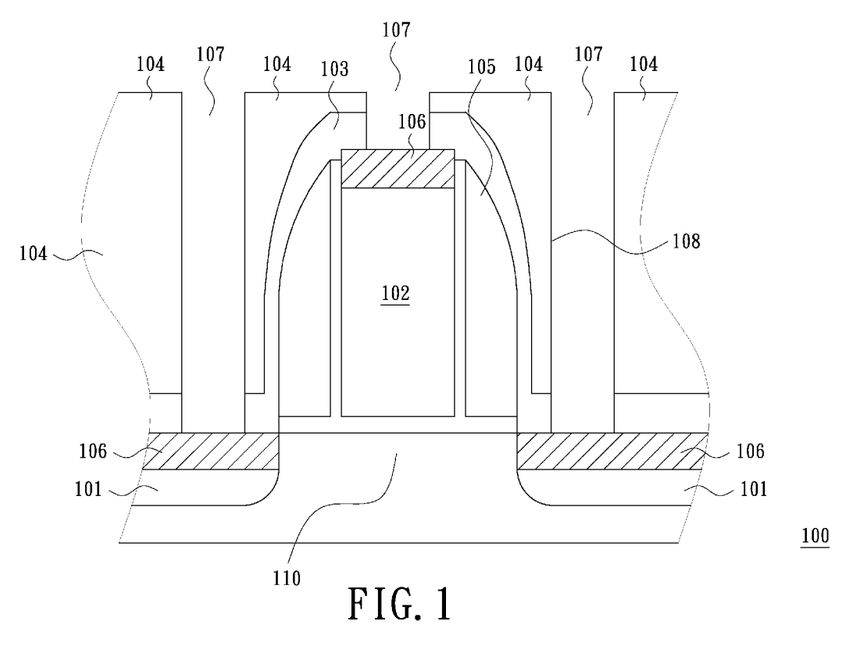
FIG. 1 illustrates a schematic, cross-sectional view of a metal oxide semiconductor (MOS) transistor in accordance with an embodiment of the present invention.

A metal oxide semiconductor (MOS) transistor with a ploy-silicon gate is a familiar semiconductor component. FIG. 1 illustrates a schematic, cross-sectional view of a MOS transistor in accordance with an embodiment of the present invention. In the following description, a cleaning method will be applied to a MOS transistor 100 in a manufacturing process of the MOS transistor. The MOS transistor 100 includes a channel region 110, a source/drain region 101, a gate structure 102, a salicide layer 106, a spacer 105, a contact etch stop layer (CESL) 103, and an inter layer dielectric (ILD) 104. The inter layer dielectric 104 is generally a composite material layer and includes a material with low dielectric constant, borophosphosilicate glass (BPSG), undoped silicate glass (USG), tetraethooxysihme (TEOS) oxide, silicon-carbonitride (SiCN), silicon carbide (SiC) or a combination thereof. A contact through hole 107 is defined in the MOS transistor 100, and the salicide layer 106 on the source/drain region 101 is exposed from the contact through hole 107. Thus, when a conductive material is filled into the contact through hole 107, the source/drain region 101 can electrically connected to an external circuit (not shown).

After the contact through hole 107 is defined, a byproduct is prone to be deposited on a surface of the salicide layer 106 of the source/drain region 101 and be located at a bottom of the contact through hole 107. The byproduct will affect the electrically connection of the source/drain region 101 and the external circuit. Additionally, the contact through hole 107 penetrates a number of different material layers such as the inter layer dielectric 104 and the contact etch stop layer 103. In the present embodiment, the inter layer dielectric 104 is, for example, a silicon oxide layer, and the contact etch stop layer 103 is, for example, a silicon nitride layer. Meanwhile, the contact through hole 107 is defined in the MOS transistor 100 to form a side wall 108.

In the present embodiment, a cleaning method including the following steps is performed. At first, a degassing process is optionally applied to the contact through hole 107. The degassing process is configured for removing a residual etchant and polymer after an etching process of forming the contact through hole 107. Next, a physical cleaning process is performed so as to remove the byproduct, for example, an oxide (e.g., an silicon oxide) located at the bottom of the contact through hole 107. A physical cleaning process can be, for example, a physical bombardment process. In the present embodiment, the physical bombardment process utilizes a first reacting gas including argon. The first reacting gas is introduced into the contact through hole 107. The byproduct (e.g., the silicon oxide) located at the bottom of the contact through hole 107 is partially bombarded by the argon to be removed. That is, a portion of the byproduct (e.g., the silicon oxide) still be located at the bottom of the contact through hole 107. Because the argon ions of the first reacting gas bombard the portion of byproduct (e.g., the silicon oxide) located at the bottom of the contact through hole 107 and do not directly bombard the silicon of the source/drain region 101, the surface of the source/drain region 101 exposed from the contact through hole 107 will not uneven. Thus, when the residual byproduct (e.g., the silicon oxide) is removed in the subsequent process, an even surface of the source/drain region 101 can be exposed from the contact through hole 107, thereby avoiding a leakage current problem and the increase problem of the resistance as mentioned above.

After the physical cleaning process is performed, the residual byproduct (e.g., the silicon oxide) is removed by a chemical cleaning process, for example, a chemical cleaning process. In the present embodiment, a chemical cleaning process is a fluorine-based chemical cleaning process. The reacting apparatus has a vacuum environment. Thus, after the residual byproduct (e.g., the silicon oxide) is removed, the source/drain region 101 exposed from the contact through hole 107 will not be oxidized again. In the present embodiment, the fluorine-based chemical cleaning process utilizes a second reacting gas including ammonia ($NH_3$) and nitrogen trifluoride ($NF_3$). The second reacting gas is introduced into the contact through hole 107. The residual byproduct (e.g., the silicon oxide) at the bottom of the contact through hole 107 is etched by the ammonia and the nitrogen trifluoride to form a byproduct of $(NH_4)_2SiF_6$. The principle of the fluorine-based chemical cleaning process will be described in the following description about the first cleaning process in another embodiment. After the chemical cleaning process, the side wall 108 should be smooth so that the contact through hole 107 has a good profile. The byproduct in the contact through hole 107 is then be removed by a thermal process. It is noted that, if the byproduct (e.g., the silicon oxide) at the bottom of the contact through hole 107 can not be removed entirely, the byproduct (e.g., the silicon oxide) can be removed by a number of other similar chemical cleaning processes after performing the chemical cleaning process.

It is also noted that a semiconductor component usually includes a number of material layers formed thereon, a contact through hole is defined in the material layers of the semiconductor component to form a side wall comprised of the material layers. When an etchant is applied to the material layers, the lateral etching rates of the material layers are different due to different etching selectivity. As a result, a surface of the side wall is rugged and a profile of the contact through hole is not qualified. The profile of the contact through hole will increase a filling difficulty of a filling material filled in the contact through hole, thereby affecting a filling quality of the filling material filled in the contact through hole. In another embodiment, the present invention also provides a cleaning method of a semiconductor manufacturing process to overcome the above disadvantages.

Again, referring to FIG. 1, the contact through hole 107 is defined in the MOS transistor 100 to form the side wall 108. In the present embodiment, the contact hole 107 is defined in the contact etch stop layer 103 and the inter layer dielectric 104, and the side wall 108 and the salicide layer 106 on the source/drain region 101 are exposed from the contact through hole 107. Thus, when a conductive material is filled into the contacted hole 107, the source/drain region 101 can electrically connected to an external circuit (not shown). The side wall 108 is comprised of a side of the inter layer dielectric 104 and a side of the contact etch stop layer 103.

After the contact through hole 107 is defined, the byproduct (e.g., the silicon oxide) is prone to be deposited on a surface of the salicide layer 106 on the source/drain region 101 exposed from the contact through hole 107 and be located at the bottom of the contact through hole 107. The byproduct (e.g., the silicon oxide) will affect the electrically connection of the source/drain region 101 and the external circuit. After the contact through hole 107 is formed, the byproduct (e.g., the silicon oxide) located at the bottom of the contact through hole 107 should be cleaned and removed. Meanwhile, the side wall 108 should be smooth so that the contact through hole 107 has a good profile after cleaning.

In the present embodiment, a cleaning method includes the following steps. At first, a degassing process is applied to the contact through hole 107. The degassing process is configured for removing a residual etchant after an etching process of forming the contact through hole 107. The degassing process is a selective process in the cleaning method. The degassing process can be, for example, a thermal treatment. Because a thermal process will be performed to remove a subsequent byproduct, the degassing process can omitted here.

Next, a first cleaning process is performed so as to remove the byproduct (e.g., the silicon oxide) located at the bottom of the contact through hole 107. In order to expressly describe the cleaning method, in the following description, the inter layer dielectric 104 is defined to a first material layer 104, and the contact etch stop layer 103 is defined to a second material layer 103. In the present embodiment, the MOS transistor 100 is displaced on a reacting apparatus, for example, a Siconi Preclean chamber developed by Applied Materials. The first cleaning process is a fluorine-based chemical cleaning process. The reacting apparatus has a vacuum environment. Thus, after the byproduct (e.g., the silicon oxide) is removed, the surfaces exposed from the contact through hole 107 will not be oxidized again. In the present embodiment, the fluorine-based chemical cleaning process utilizes a second reacting gas including ammonia ($NH_3$) and nitrogen trifluoride ($NF_3$). The second reacting gas is introduced into the contact through hole 107. The byproduct (e.g., the silicon oxide) at the bottom of the contact through hole 107 is etched by the ammonia and the nitrogen trifluoride, thereby being removed. During the first cleaning process, the side wall 108 will also be etched. Because the side wall 108 is comprised of the first material layer 104 and the second material layer 103, and a lateral etching rate of the first material layer 104 and that of the second material layer 103 are different, an operating time of the first cleaning process is determined by the first material layer 104 and the second material layer 103. It is noted that, the lateral etched thickness is an etched thickness along a direction perpendicular to the side wall 108. After the first cleaning process, the side wall 108 should be smooth so that the contact through hole 107 has a good profile.

Figure 2:
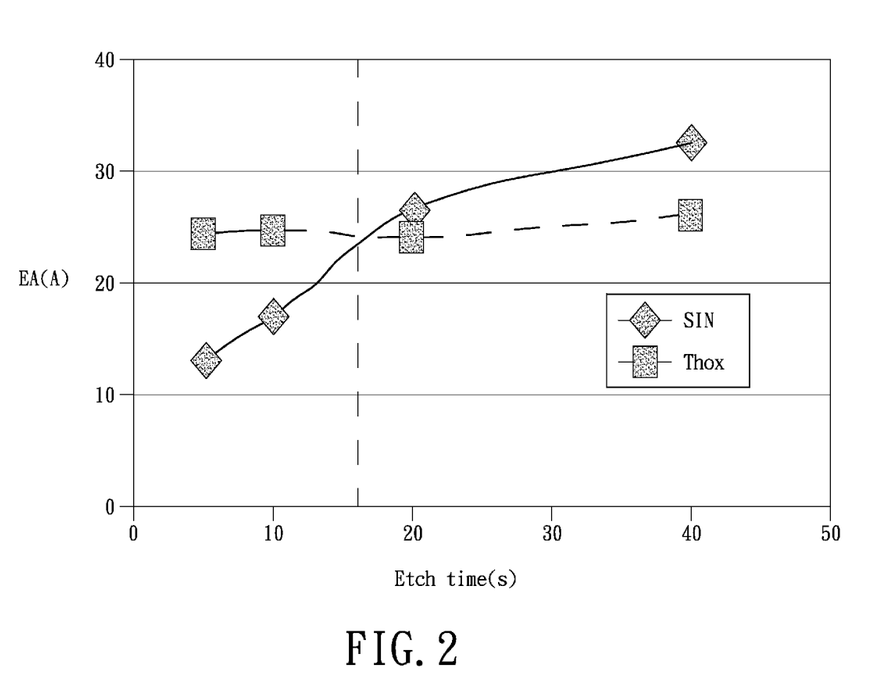
FIG. 2 illustrates a relationship graph of a lateral etched thicknesses of a first material layer and a second material layer and an operating time in accordance with an embodiment of the present invention.

Referring to FIG. 2, FIG. 2 illustrates a relationship graph of lateral etched thicknesses of a first material layer and a second material layer and an operating time in accordance with an embodiment of the present invention. In the present embodiment, an operating temperature of the first cleaning process is less than 50° C., a flow rate of the ammonia is 5 standard cubic centimeter per minute (SCCM), and a flow rate of the nitrogen trifluoride is 100 standard cubic centimeter per minute (SCCM). Still, referring to FIG. 2, at the beginning of the first cleaning process, a lateral etched thickness of the first material layer 104 is greater than a lateral etched thickness of the second material layer 103. After the first cleaning process is performed for 17 seconds, the lateral etched thickness of the first material layer 104 is gradually equal to the lateral etched thickness of the second material layer 103. Therefore, the first cleaning process is stopped after the first cleaning process is performed for 17 seconds. In other words, an operating time of the first cleaning process is 17 seconds. That is, the first cleaning process is performed till the lateral etched thickness of the first material layer 104 is equal to the lateral etched thickness of the second material layer 103.

The first cleaning process includes the following reaction equations:

$$NF_3 + NH_3 \rightarrow NH_4F + NH_4F \cdot HF$$

$$NH_4F + NH_4F \cdot HF + SiO_2 \rightarrow (NH_4)_2SiF_{6(S)} + H_2O$$

As mentioned above, the byproduct will be formed in the contact through hole 107 during the first cleaning process. In the present embodiment, the byproduct is $(NH_4)_2SiF_6$. The byproduct in the contact through hole 107 is then be removed by a thermal process. For example, a heat source is provided. A temperature of the heat source is 180° C. The MOS transistor 100 is moved to approach the heat source. In the present embodiment, the byproduct of $(NH_4)_2SiF_6$ is heated so that the byproduct of $(NH_4)_2SiF_6$ is sublimated at a sublimation temperature (about 120° C.) to be removed. A reaction equation of removing the byproduct of $(NH_4)_2SiF_6$ are as follow:

$$(NH4)_2SiF_{6(S)} \rightarrow SiF_{4(g)} + NH_{3(g)}$$

After the step of removing the byproduct, maybe the byproduct (e.g., the silicon oxide) does not be removed entirely. That is, a portion of the byproduct (e.g., the silicon oxide) still be located at the bottom of the contact through hole 107. A second cleaning process can be performed so as to remove the residual the byproduct (e.g., the silicon oxide) at the bottom of the contact through hole 107. In the present embodiment, the second cleaning process is identical to the first cleaning process and is not described here. During the second cleaning process, the side wall 108 will also be etched. An operating time of the second cleaning process is also determined by the first material layer 104 and the second material layer 103. The second cleaning process is performed till the lateral etched thickness of the first material layer 104 is equal to the lateral etched thickness of the second material layer 103. In other words, in the present embodiment, an operating time of the second cleaning process is also 17 seconds. Moreover, the first cleaning process, the step of removing the byproduct and the second cleaning process are performed on a common apparatus, for example, the reacting apparatus as mentioned above.

It is noted that, if the byproduct (e.g., the silicon oxide) at the bottom of the contact through hole 107 can not be removed entirely, the residual the byproduct (e.g., the silicon oxide) can be removed by a number of cleaning processes after the first and second cleaning processes. A flow rate of the reacting gas is controlled, each of the cleaning processes is performed till a lateral etched thickness of the first material layer 104 is equal to a lateral etched thickness of the second material layer 103. That is, each of the cleaning processes is stopped when a lateral etched thickness of the first material layer 104 is equal to a lateral etched thickness of the second material layer 103. Thus, the side wall 108 is smooth after the cleaning processes and the silicon oxide is entirely removed.

In addition, the second cleaning process can be different from the first cleaning process. For example, an operating temperature of the second cleaning process can be different from the operating temperature of first cleaning process, and a flow rate ratio of the reacting gas of the second cleaning process can be different from the flow rate ratio of first cleaning process.

Figure 3:
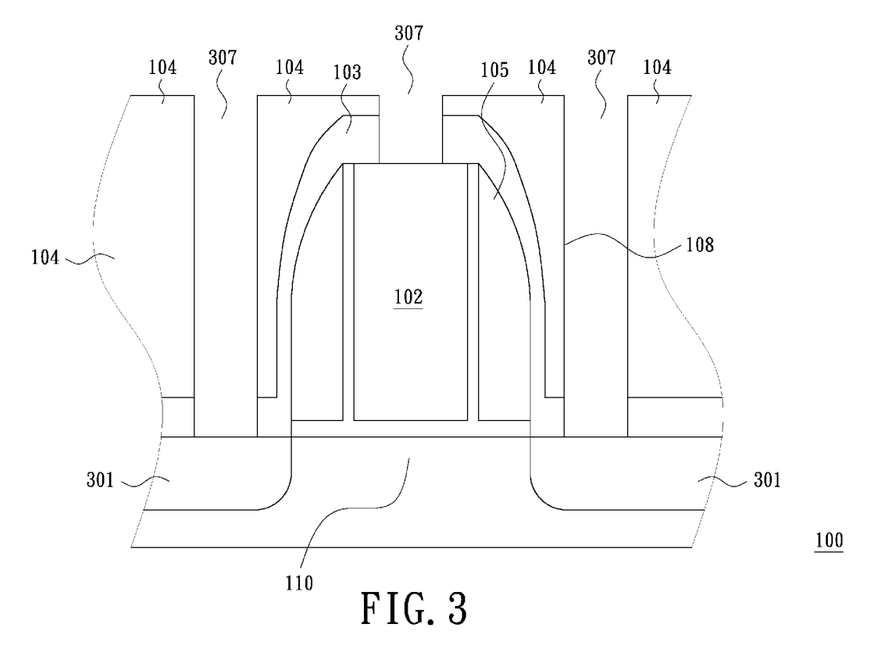
FIG. 3 illustrates a schematic, cross-sectional view of a metal oxide semiconductor (MOS) transistor in accordance with another embodiment of the present invention.

Additionally, in the aforesaid embodiment, the salicide layer can be formed before forming the contact through hole. It is noted that, the salicide layer can also be formed after forming the contact through hole. Referring to FIG. 3, when the salicide layer (not shown) is formed after forming the contact through hole 307, a surface of the source/drain region 301 is exposed from the contact through hole 307. The contact through hole 307 is defined in a contact etch stop layer (CESL) 303 and an inter layer dielectric (ILD) 304. The surface of the source/drain region 301 is exposed from the contact through hole 307 is prone to be oxidized to form a byproduct, for example, a silicon oxide, thereby affecting the electrically connection of the source/drain region 301 and the external circuit. Further, an oxidized surface of the source/drain region 301 is exposed from the contact through hole 307, thereby affecting a formation of the salicide layer and causing a leakage current problem and the increase problem of the resistance. Thus, before forming the salicide layer, the cleaning method can be used to clean the contact through hole 307 and the oxidized surface of the source/drain region 301 exposed from the contact through hole 307, thereby avoiding causing a leakage current problem and the increase problem of the resistance as mentioned above.

Figure 4:
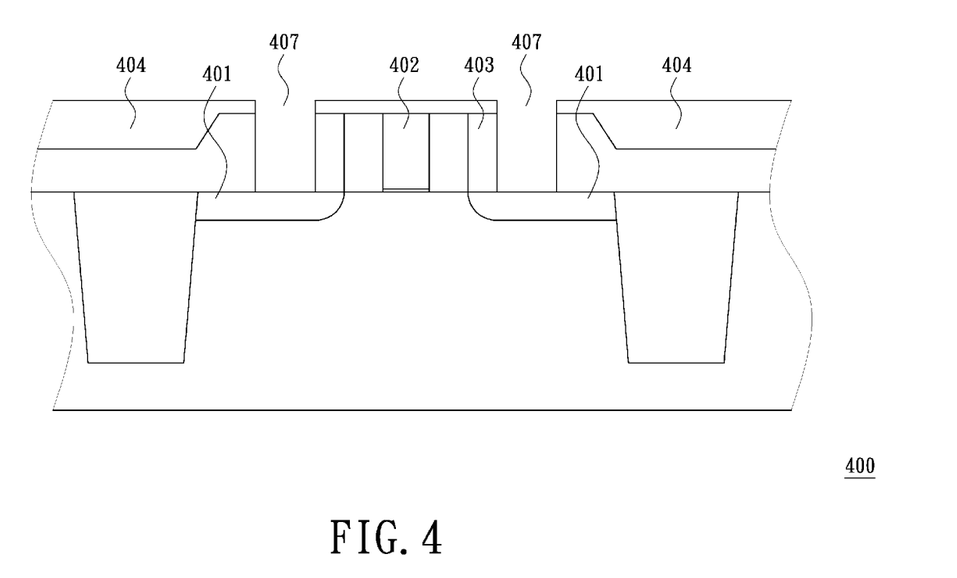
FIG. 4 illustrates a schematic, cross-sectional view of a metal oxide semiconductor (MOS) transistor in accordance with still another embodiment of the present invention.

In other embodiments, for example, in a manufacturing of a transistor with a metal gate, the salicide layer can be formed before forming the contact through hole or after forming the contact through hole. Referring to FIG. 4, the transistor 400 with a metal gate 402 is manufactured. When the salicide layer (not shown) is formed after forming the contact through hole 407, a surface of the source/drain region 401 is exposed from the contact through hole 407. The contact through hole 407 is defined at least in a contact etch stop layer (CESL) 403 and an inter layer dielectric (ILD) 404. The surface of the source/drain region 401 is exposed from the contact through hole 407 is prone to be oxidized to form a byproduct, for example, a silicon oxide. Similarly, the cleaning method of the present invention can be applied.

In summary, the cleaning method includes a physical cleaning process (e.g., an argon physical bombardment process) and a chemical cleaning process (e.g., fluorine-based chemical cleaning process) so that remove the oxide located at the bottom of the contact through hole of the semiconductor component. The cleaning method can avoid increasing the resistance of the contact through hole of the semiconductor component and avoid enlarging the size of the contact through hole. The chemical cleaning process includes at least a fluorine-based chemical cleaning process, which is performed till the lateral etched thicknesses of the material layers are equal to each other. Therefore, the side wall comprised of the first material layer and the second material layer is smooth after the chemical cleaning process, the oxide at the bottom of the contact through hole is entirely removed. Further, the byproduct can be removed by a thermal process, the deposition phenomenon of the byproduct during the chemical cleaning process can be avoided.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A cleaning method of a semiconductor manufacturing process, the cleaning method being applied to a semiconductor component, the semiconductor component having a plurality of material layers, an opening being defined in the material layers, a side wall being exposed from the opening, the side wall at least comprising a first material layer and a second material layer, the cleaning method comprising:
    performing a first cleaning process for an operating time, wherein after the operating time, the first cleaning process is stopped upon when a lateral etched thickness of the first material layer is equal to a lateral etched thickness of the second material layer; and
    removing a byproduct formed in the first cleaning process.

2. The cleaning method as claimed in claim 1, wherein the opening is a contact through hole, the first material layer is a silicon oxide layer, and the second material layer is a silicon nitride layer.

3. The cleaning method as claimed in claim 1, after removing the byproduct, further comprising performing a second cleaning process for the operating time, wherein after the operating time, the second cleaning process is stopped upon when a lateral etched thickness of the first material layer is equal to a lateral etched thickness of the second material layer.

4. The cleaning method as claimed in claim 3, wherein the first cleaning process, the step of removing the byproduct and the second cleaning process are performed on a common apparatus.

5. The cleaning method as claimed in claim 3, wherein the first cleaning process is a chemical cleaning process.

6. The cleaning method as claimed in claim 3, wherein the second cleaning process is a chemical cleaning process.

7. The cleaning method as claimed in claim 6, before performing the first cleaning process, further comprising a physical cleaning process, the physical cleaning process comprising:
    introducing a first reacting gas comprising argon so as to partially remove an oxide generated in the semiconductor manufacturing process and located at a bottom of the contact through hole.

8. The cleaning method as claimed in claim 3, wherein the second cleaning process is a fluorine-based chemical cleaning process.

9. The cleaning method as claimed in claim 8, wherein the fluorine-based chemical cleaning process utilizes a second reacting gas comprising ammonia and nitrogen trifluoride, an operating temperature of the fluorine-based chemical cleaning process is less than 50° C., a flow rate of the ammonia is 5 standard cubic centimeter per minute, a flow rate of the nitrogen trifluoride is 100 standard cubic centimeter per minute, and an operating time of the fluorine-based chemical cleaning process is 17 seconds.

10. The cleaning method as claimed in claim 1, wherein the byproduct is $(NH_4)_2SiF_6$, and the byproduct is removed by applying a thermal process to the semiconductor component.

11. The cleaning method as claimed in claim 10, wherein the thermal process comprises:
    providing a heat source, a temperature of the heating source being 180° C.; and
    moving the semiconductor component to approach the heat source so that the byproduct is removed at a sublimation temperature.

12. The cleaning method as claimed in claim 1, before performing the first cleaning process, further comprising a degassing process.

13. The cleaning method as claimed in claim 1, after performing the first cleaning process and removing the byproduct formed in the first cleaning process, further comprising:
    a plurality of cleaning processes, each of the cleaning processes being performed and then stopped upon when a lateral etched thickness of the first material layer is equal to a lateral etched thickness of the second material layer; and
    a step of removing a byproduct formed in each of the cleaning processes.

14. A cleaning method of a semiconductor manufacturing process, the cleaning method being applied to a contact through hole of a semiconductor component, the cleaning method comprising:
    performing a physical cleaning process to partially remove a silicon oxide generated in the semiconductor manufacturing process and located at a bottom of the contact through hole, wherein the contact through hole is defined in the semiconductor component to form a side wall comprising at least a first material layer and a second material layer; and
    performing a chemical cleaning process to remove the residual silicon oxide located at the bottom of the contact through hole; wherein the chemical cleaning process comprises:
        performing a first cleaning process for an operating time, wherein after the operating time, the first cleaning process is stopped upon when a lateral etched thickness of the first material layer is equal to a lateral etched thickness of the second material layer; and
        removing a byproduct formed in the first cleaning process.

15. The cleaning method as claimed in claim 14, wherein the physical cleaning process comprises:
    introducing a first reacting gas comprising argon.

16. The cleaning method as claimed in claim 14, wherein the first material layer is a silicon oxide layer, and the second material layer is a silicon nitride layer.

17. The cleaning method as claimed in claim 14, wherein the chemical cleaning process comprises:
    a plurality of cleaning processes after performing the first cleaning process, each of the cleaning processes being performed and then stopped upon when a lateral etched thickness of the first material layer is equal to a lateral etched thickness of the second material layer; and
    a step of removing a byproduct formed in each of the cleaning processes.

18. The cleaning method as claimed in claim 17, wherein the chemical cleaning process is a fluorine-based chemical cleaning process.

19. The cleaning method as claimed in claim 18, wherein the fluorine-based chemical cleaning process utilizes a second reacting gas comprising ammonia and nitrogen trifluoride, an operating temperature of the fluorine-based chemical cleaning process is less than 50° C., a flow rate of the ammonia is 5 standard cubic centimeter per minute, a flow rate of the nitrogen trifluoride is 100 standard cubic centimeter per minute, and an operating time of the fluorine-based chemical cleaning process is 17 seconds.

20. The cleaning method as claimed in claim 19, wherein the byproduct is $(NH_4)_2SiF_6$, and the byproduct is removed by applying a thermal process to the semiconductor component.

21. The cleaning method as claimed in claim 20, wherein the thermal process comprises:
   providing a heat source, a temperature of the heating source being 180° C.; and
   moving the semiconductor component to approach the heat source so that the byproduct is removed at a sublimation temperature.

22. The cleaning method as claimed in claim 14, further comprising a degassing process before performing the physical cleaning process.

\* \* \* \* \*